United States Patent [19]

Lace

[11] 4,086,647

[45] Apr. 25, 1978

[54] AMPLITUDE RESPONSIVE SPEED SWITCH CONTROL

[75] Inventor: Melvin A. Lace, Prospect Heights, Ill.

[73] Assignee: Synchro-Start Products, Inc., Skokie, Ill.

[21] Appl. No.: 732,773

[22] Filed: Oct. 15, 1976

[51] Int. Cl.² .............................................. H02P 5/00
[52] U.S. Cl. .................................... 361/239; 361/241
[58] Field of Search ..................... 361/236, 239, 241; 307/315; 323/22 T, 40; 310/156

[56] References Cited

U.S. PATENT DOCUMENTS

| | | | |
|---|---|---|---|
| 3,178,612 | 4/1965 | Kerr | 361/239 |
| 3,324,378 | 6/1967 | Kupferberg et al. | 323/40 |
| 3,629,623 | 12/1971 | Sakurai et al. | 307/315 |
| 3,710,186 | 1/1973 | Sharp | 361/239 |
| 3,860,843 | 1/1975 | Kawasaki et al. | 310/156 |
| 3,862,432 | 1/1975 | Larson | 307/315 |
| 4,013,904 | 3/1977 | Chick | 307/315 |
| 4,025,810 | 5/1977 | Field | 310/156 |

Primary Examiner—Gerald Goldberg
Attorney, Agent, or Firm—Kinzer, Plyer, Dorn & McEachran

[57] ABSTRACT

A speed-switch control comprising a multi-pole subfractional permanent magnet A.C. generator driven by a shaft; the generator develops an initial A.C. signal having an amplitude representative of the shaft speed, and that signal is applied to a threshold circuit where it is rectified and compared with a threshold amplitude correlated with a critical shaft speed range to generate a D.C. switch actuation signal. The D.C. switch actuation signal actuates a solid-state switching circuit to switch a controlled load, such as a safety interlock or alarm, into and out of an external operating circuit.

5 Claims, 5 Drawing Figures

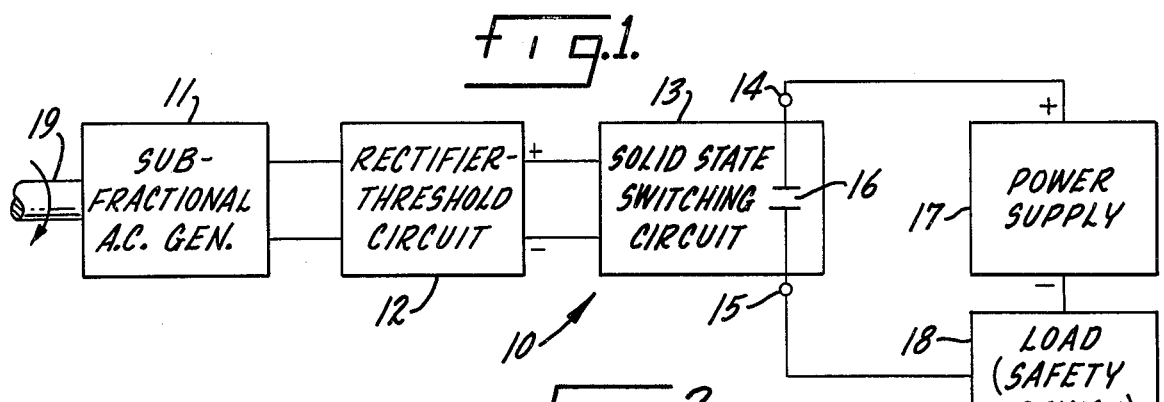
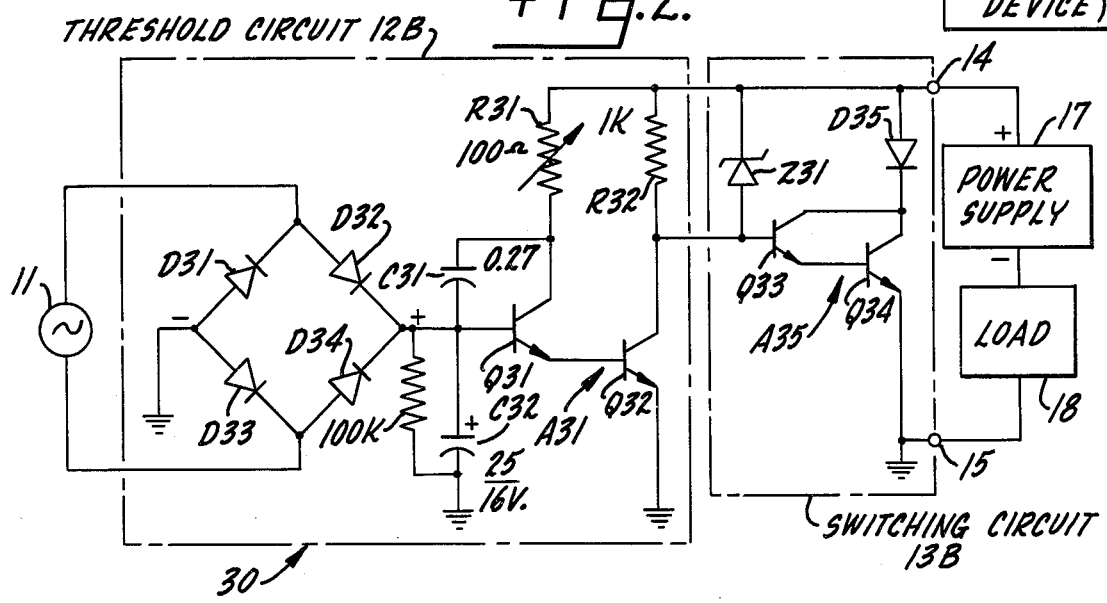
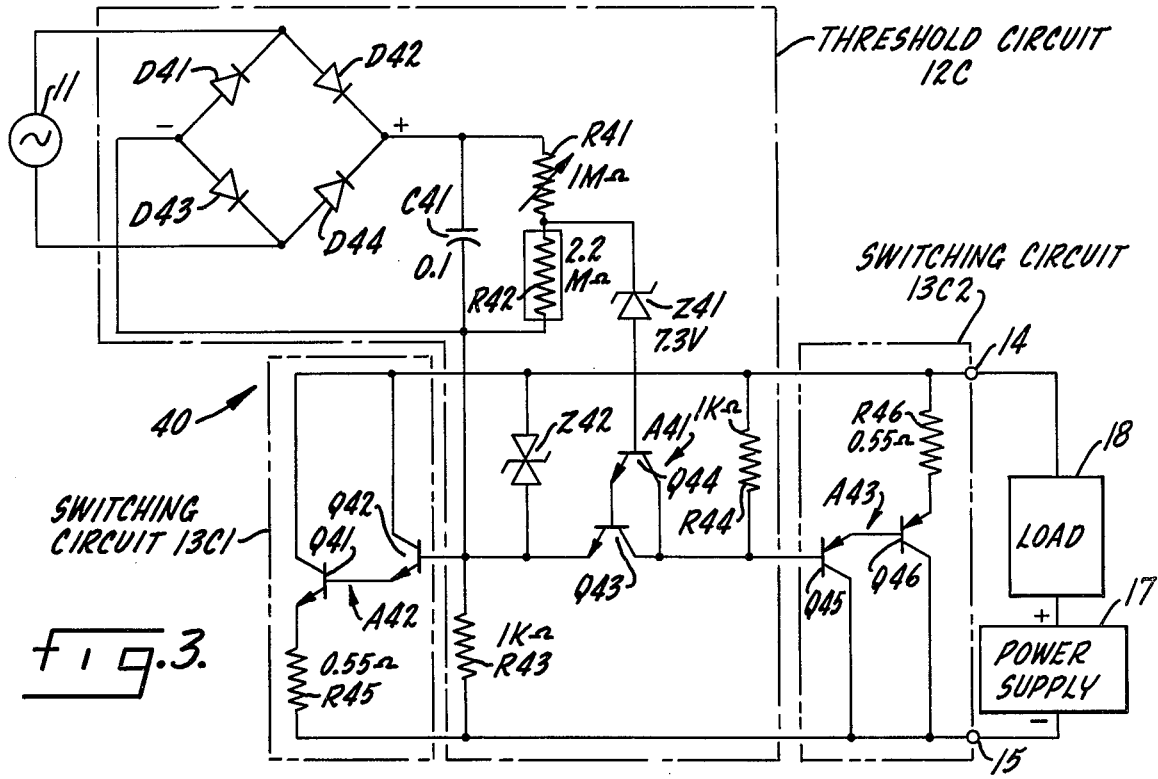

AMPLITUDE RESPONSIVE SPEED SWITCH CONTROL

BACKGROUND OF THE INVENTION

There are numerous applications in which it is necessary or desirable to control some form of interlock or other electrical safety circuit in accordance with the speed of a rotating shaft. In many instances, these are vehicular applications; for example, an electrical interlock to assure closing the doors of a passenger vehicle whenever the vehicle is moving above a predetermined threshold speed, or an electrically actuated interlock mechanism to preclude shifting a vehicle transmission into reverse gear whenever the vehicle is moving in a forward direction at even a limited threshold speed. Similar speed switch control requirements, based upon the rotational speed of a shaft or like rotary member, are also commonly encountered in connection with machine tools and other industrial equipment.

The requirements imposed upon speed switch controls of this general type, particularly those employed in vehicular applications, are frequently quite severe. Thus, the control may be subjected to high levels of vibration and to substantial shock forces. Electrical transients of substantial magnitude may be encountered. Because the control does not perform a primary operational function, it is frequently subject to severe cost limitations. In addition, it is highly desirable that the electrical connections to the control be as simple as possible, preferably constituting a simple two-terminal connection, to minimize cost and to facilitate replacement when necessary.

A variety of different speed switch controls have been devised for use in applications of this kind; many of these controls are based upon an input signal derived from a small AC generator driven by the shaft or like rotary member to be monitored. In many instances, the circuits of these devices have been undesirably complex, particularly because operation is based upon the frequency of the AC input signal, with a consequent need for a frequency/voltage conversion stage as a part of the control circuitry. In general, known speed switch controls have been undesirably high in cost and difficult to construct in a form rugged enough for vehicular applications, in large part due to the circuit complexities introduced by frequency/voltage conversion. In addition, many of the known speed switch controls require three or four or even more terminal connections in order to provide for an external power supply, apart from the load, and have presented substantial problems with respect to providing adequate transient protection. Again, these problems are particularly acute in speed controls applied to vehicles.

SUMMARY OF THE INVENTION

It is a principal object of the present invention, therefore, to provide a new and improved speed switch control, utilizing an input signal from a sub-fractional permanent magnet AC generator driven by a rotating shaft or like rotating member, that effectively eliminates or minimizes the problems and difficulties encountered in connection with previously known controls, as described above.

Another object of the invention is to provide a new and improved speed switch control for a rotary shaft, employing an AC input signal from a small permanent magnet generator, in which the critical shaft speed is determined by effective measurement of variations in the amplitude of the input signal, without utilizing any frequency/voltage conversion stage.

A specific object of the invention is to provide a new and improved speed switch control, based upon an AC signal input from a subfractional permanent magnet AC generator driven by a rotary shaft, employing an extremely simple solid state switching circuit that requires only two terminals for both load and power supply connections, that can be readily protected against transient voltages appearing at the switching terminals, and that can be readily constructed in a form rugged enough for difficult vehicular applications.

Accordingly, the invention relates to a speed switch control actuated in response to changes in the speed of a rotary shaft above and below a threshold speed. The control comprises a multi-pole subfractional permanent magnet AC generator connectable to a rotary shaft, for generating an initial AC signal having an amplitude which varies in accordance with changes in the speed of the shaft. Threshold circuit means are connected to the generator for developing a DC switch actuation signal whenever the amplitude of the initial AC signal exceeds a given threshold amplitude indicative of a critical shaft speed. A solid state switching circuit having two switch terminals is incorporated in the control; the switch terminals are connectable in series with an external DC power supply in an operating circuit for a controlled load. The switching circuit has an input connected to the threshold circuit means and is effective to switch the controlled load into and out of its operating circuit in response to the presence or absence of the switch actuation signal. The switching circuit may constitute either a normally closed or a normally open switch.

BRIEF DESCRIPTION OF THE DRAWINGS

FIG. 1 is a simplified block diagram illustrating the principles of the present invention;

FIG. 2 is a schematic circuit diagram for a speed switch control constructed in accordance with one embodiment of the present invention;

FIG. 3 is a schematic circuit diagram illustrating a speed switch control constructed in accordance with another embodiment of the invention;

DESCRIPTION OF THE PREFERRED EMBODIMENTS

Figure 4:
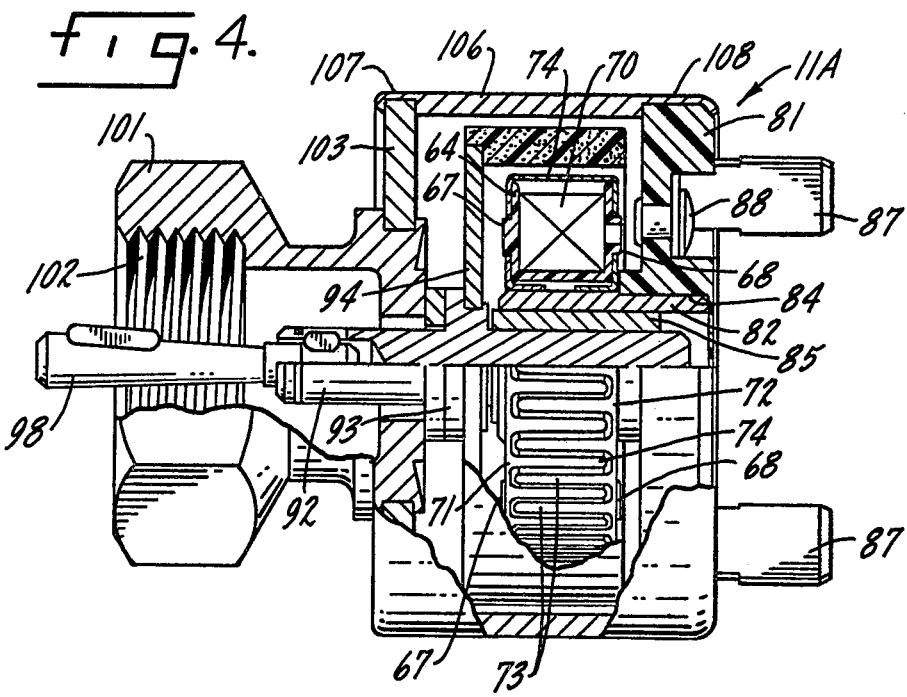
FIG. 4 is a partly sectional elevation view of a preferred form of subfractional permanent magnet AC generator used in the speed-switch controls of FIGS. 2 and 3.

FIG. 1 illustrates, in simplified block diagram form, a speed switch control 10 incorporating the principles of the present invention. Control 10 comprises a subfractional multi-pole permanent magnet AC generator 11 connected to an external rotating shaft 19. In a given instance, for example, shaft 19 might be driven from the speedometer cable, the drive shaft, or the transmission of a vehicle. On the other hand, shaft 19 may constitute an operating shaft of an industrial machine or virtually any other shaft or rotating member to be monitored for a safety function or other control purpose. A preferred construction for generator 11 is the sixty-pole AC generator disclosed and claimed in the co-pending application of Melvin A. Lace, Ser. No. 729,272, filed Oct. 4, 1976, and described hereinafter in conjunction with FIGS. 4 and 5.

In the speed-switch control 10, the output of the AC generator 11 is electrically connected to a rectifier and threshold circuit 12 having a DC output coupled to a solid state switching circuit 13. Circuit 13 has two switch terminals 14 and 15 connected to a pair of normally open switch contacts 16 within the switching circuit. Contacts 16 are illustrated in FIG. 1 merely for purposes of explanation; the solid state switching circuit 13 does not include any mechanically actuatable contacts but uses a solid state circuit to perform the equivalent switching function.

Terminals 14 and 15 are electrically connected in a series circuit that includes an external power supply 17 and a load 18. In a vehicular application, power supply 17 may comprise the vehicle battery. In an industrial application, a separate power supply circuit energized from a local power source may be employed. Load 18 is most frequently an alarm, a safety interlock circuit, or other safety device. For example, passenger vehicle load 18 may comprise an electrically-actuated interlock to prevent opening of a door whenever the vehicle is moving above some critical speed. In another application, load 18 may comprise an interlock to prevent shifting of a vehicle transmission into reverse gear when the vehicle is moving, even at very low speed, in a forward direction. Of course, load 18 may comprise a simple visual or audible alarm in both industrial and vehicular applications.

In the operation of speed switch control 10, FIG. 1, generator 11 generates an initial AC signal having an amplitude representative of the rotational speed of shaft 19. The relation between the output amplitude of generator 11 and the speed of shaft 19 is not truly linear. Rather, the peak-to-peak output voltage of generator 11 generally conforms to a curve like curve 51 in FIG. 5. However, over an initial speed range, in this instance from zero to about four hundred rpm, the speed-voltage curve is a close approximation to a linear relationship and the generator output amplitude is generally representative of the shaft speed.

The initial AC signal developed by generator 11 (FIG. 1) is rectified in threshold circuit 12 and is employed to develop a DC switch actuation signal whenever the amplitude of the input AC signal exceeds a given threshold value indicative of a critical shaft speed. A variety of different circuit arrangements can be employed in threshold circuit 12, specific examples being given hereinafter in connection with FIGS. 2 and 3.

The DC switch actuation signal output from threshold circuit 12 is applied to the solid state switching circuit 13. Switching circuit 13 normally maintains an open circuit condition, schematically indicated by the open contacts 16, for the external operating circuit of load 18, comprising power supply 17 and switching terminals 14 and 15. When a DC switch actuation signal from threshold circuit 12 is applied to switching circuit 13, however, the external circuit is closed, as would be effected by closing contacts 16. Thus, load 18 is energized from power supply 17 only when shaft 19 is rotating at some speed above the critical speed determined by the threshold of circuit 12.

FIG. 2 affords a schematic diagram of a self-contained speed-switch control 30 which corresponds essentially to the control 10 of FIG. 1 except that device 30 functions as a normally closed switch rather than a normally open switch. In control 30, a sub-fractional AC generator 11 driven from an external shaft (not shown) is connected to the input terminals of a full-wave rectifier bridge comprising four diodes D31 through D34. The initial AC signal developed by generator 11 has an amplitude representative of the speed of the shaft that drives the generator.

The negative terminal of bridge D31–D34 is connected to system ground. The positive terminal of the bridge is connected to a filter capacitor C32 that is returned to system ground and is also connected to the base of a first transistor Q31 in a Darlington amplifier A31. The emitter of transistor Q31 is connected to the base of a second transistor Q32 included in amplifier A31, the emitter of transistor Q32 being returned to system ground. The collector of transistor Q31 is connected through a resistor R31 to one switching terminal 14 of control 30 and is also coupled back to the base of the transistor through a feedback capacitor C31. The collector of transistor Q32 is connected to the switching terminal 14 through a load resistor R32. The bridge circuit D31–D34 and amplifier A31 constitute a threshold circuit 12B for control 30.

Control 30 further comprises a solid state switching circuit 13B comprising a second Darlington amplifier A35 including two transistors Q33 and Q34. The base of transistor Q33 is connected to the collector of transistor Q32 in threshold circuit 12B and is also connected to switching terminal 14 through a zener diode Z31. The collectors of the transistors Q33 and Q34 are connected together and the emitter of transistor Q33 is connected to the base of transistor Q34. The collectors of the two transistors in amplifier A35 are connected to switching terminal 14 through a diode D35. The emitter of transistor Q34 is connected to system ground and to the second switching terminal 15 of control 30. An external DC power supply 17 and a load 18 are connected in series across the switching terminals 14 and 15 with the positive output of the power supply connected to terminal 14.

In considering the operation of speed-switch control 30, it may first be assumed that the shaft driving AC generator 11 is not rotating so that there is no output from the generator. For this condition, amplifier A31 is biased to cut off but amplifier A35 is maintained conductive by the positive bias applied to the base of transistor Q33 through the circuit comprising power supply 17, switching terminal 14, and resistor R32 in threshold circuit 12B.

If the shaft driving AC generator 11 now begins to rotate, a DC signal of increasing amplitude with increasing speed is developed at the output terminals of rectifier bridge D31–D34. When the shaft speed exceeds a critical value, the positive DC signal supplied to the base of transistor Q31 from the bridge drives amplifier A31 to conduction. The shaft speed at which this action occurs is determined by the circuit components, particularly resistor R31.

When amplifier A31 is actuated to conduction, the base of transistor Q33 in switching circuit 13B loses its positive bias, due to the voltage drop across resistor R32. As a consequence, amplifier A35 can no longer maintain conduction. Thus, transistor Q34 is driven from its conductive condition to its non-conductive condition, effectively opening the operating circuit for load 18 at transistor Q34. There is a conductive path between switch terminals 14 and 15 through transistor Q32, but the high resistance of resistor R32 makes this an effective "open" circuit for many applications. In effect, therefore, the circuit for load 18 can be effectively switched off.

Speed-switch control 30 has been constructed to provide for effective opening of the operating circuit to load 18, across switching terminals 14 and 15, at a threshold shaft speed of 32 rpm. For this particular device, the circuit was constructed with the component values shown in FIG. 3 and using GET-706 transistors for transistors Q31, Q32 and Q33 and a 2N5298 transistor for transistor Q34. In this specific construction diodes D31–D35 were all type 1N5059. Diode Z31 is provided only for transient protection and is not critical to normal operation of the circuit. To change the threshold speed for control 30, resistor R31 can be adjusted, if a variable resistor or potentiometer is used as shown or a different resistance can be connected in the circuit.

FIG. 3 illustrates a self-contained speed-switch control 40 corresponding essentially to the block diagram of control 10 (FIG. 1) except that a dual solid state switching circuit is employed. In control 40, the output of a small permanent magnet AC generator 11 driven from a shaft to be monitored (not shown) is connected to a full wave rectifier bridge comprising four diodes D41 through D44. A voltage divider comprising two series resistors R41 and R42 is connected across the positive and negative terminals of the bridge in parallel with a filter capacitor C41. Preferably, resistor R42 is a temperature sensitive resistance providing compensation for changes in thermal conditions.

In addition to the bridge, the threshold circuit 12C of control 40 comprises a Darlington output amplifier A41 including two transistors Q43 and Q44. The base of transistor Q44 is connected to the common terminal of resistors R41 and R42 through a zener diode Z41. The collectors of the two transistors are connected together and the emitter of transistor Q44 is connected to the base of transistor Q43. The emitter of transistor Q43 is connected back to the negative terminal of the rectifier bridge D41–D44 and is also connected to the switching terminal 15 of control 40 through a resistor R43. The collectors of the two transistors in amplifier A41 are connected to the other switching terminal 14 through a resistor R44. Transient protection is provided by a dual zener diode Z42 connected between switching terminal 14 and the emitter of transistor Q43.

Control 40 includes two complementary switching circuits 13C1 and 13C2. The first switching circuit 13C1 includes a Darlington amplifier A42 comprising two transistors Q41 and Q42. The collectors of the two transistors are connected to switching terminal 14. The base of transistor Q42 is connected to the emitter of transistor Q43 in threshold circuit 12C. The emitter of transistor Q42 is connected to the base of transistor Q41 and the emitter of transistor Q41 is connected through a small resistor R45 to switching terminal 15.

The second switching circuit 13C2 in control 40 (FIG. 3) comprises a Darlington amplifier A43 including two transistors Q45 and Q46. The base of transistor Q45 is connected to the collectors of the transistors in amplifier A41 of threshold circuit 12C. The collectors of transistors Q45 and Q46 are both connected to switching terminal 15. The emitter of transistor Q45 is connected to the base of transistor Q46 and the emitter of transistor Q46 is connected through a small resistor R46 to switching terminal 14. A load 18 and an external power supply 17 are connected in series across switching terminals 14 and 15 with the negative terminal of supply 17 connected to switching terminal 15.

For low speeds of the monitored shaft driving generator 11, in operation of control 40, the correspondingly low output voltage from the rectifier bridge D41–D44 is not sufficient to effect conduction through zener diode Z41. As a consequence, amplifier A41 in threshold circuit 12C remains non-conductive, there being no forward bias applied to the base of transistor Q44. For this condition, amplifiers A42 and A43 in switching circuits 13C1 and 13C2 also remain non-conductive, so that there is a very high impedance, equivalent to an open circuit, across the switching terminals 14 and 15. Thus, the operating circuit for load 18 is open.

With increasing shaft speed, however, the initial AC signal developed by generator 11 increases in amplitude, ultimately producing a DC output voltage from bridge D41–D44 sufficient to effect breakdown in zener diode Z41. When this occurs, the resulting positive voltage applied to the base of transistor Q44 drives amplifier A41 to conduction. With amplifier A41 conductive, a DC switch actuation signal of positive polarity is applied to the base of transistor Q42 in amplifier A42 and a corresponding negative DC switch actuation signal is applied to the base of transistor Q45 in amplifier A43. The two switching amplifiers A42 and A43 are thus driven to conduction. This establishes two parallel low resistance conduction paths across switching terminals 14 and 15; one path extends through transistor Q41 and resistor R45 and the other through transistor Q46 and resistor R46.

With amplifiers A42 and A43 both conductive, the switching terminals 14 and 15 are virtually short-circuited, with the same basic operating effect as the closing of a switch across the two terminals.

Figure 5:
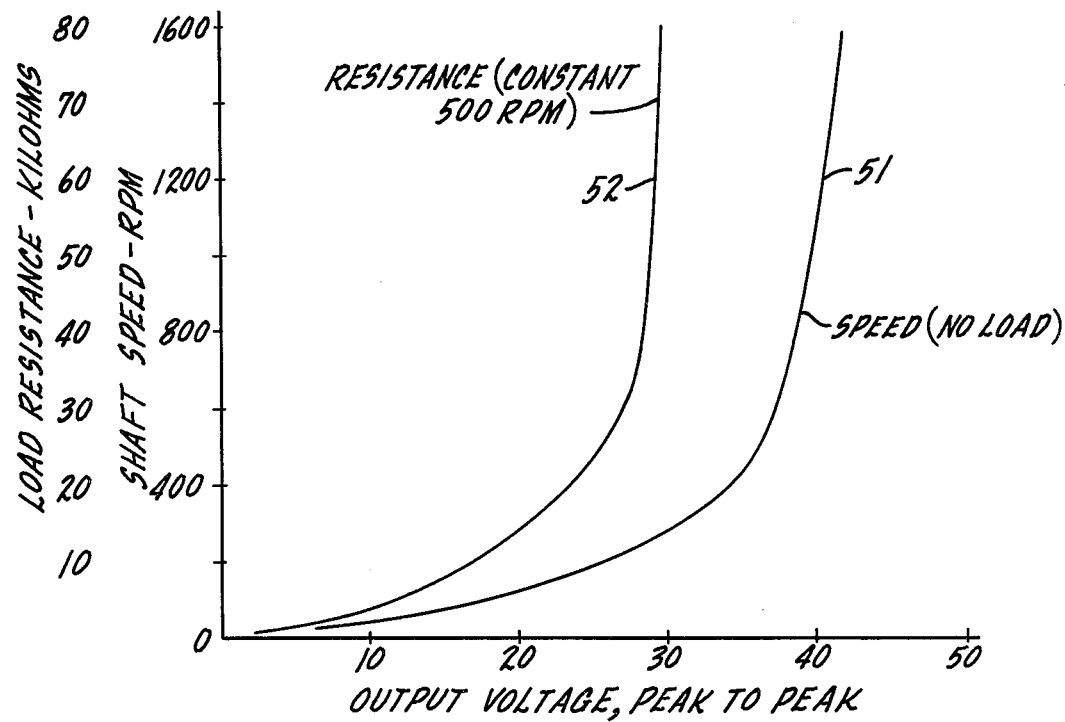
FIG. 5 illustrates the peak-to-peak output of the generator of FIG. 4.

Control 40 may be constructed with the circuit values given in FIG. 3 and utilizing 1N5059 diodes for the bridge diodes D41–D44, a 2N5298 transistor for transistor Q41, GET-706 transistors for transistors Q42, Q43 and Q44, a 2N4248 transistor for device Q45, and a 2N6107 transistor for transistor Q46. With this specific construction, initial conduction in the operating circuit for load 18, through switching terminals 14 and 15, begins at approximately 340 rpm; full conduction is reached at 415 rpm, using the preferred 60 pole permanent magnet AC generator for generator 11 (FIGS. 4 and 5). Re-calibration for different threshold speeds can be effected most conveniently by changing the value of resistor R41 or by changing the zener diode Z41 to afford a different breakdown (threshold) voltage.

FIG. 4 affords a partially sectional elevation view of a subfractional AC signal generator 11A, a generator that constitutes a preferred form of input device for the controls of FIGS. 1-3. Generator 11A is described in greater detail in the co-pending application of M. A. Lace, Ser. No. 729,272 filed Oct. 4, 1976.

Generator 11A includes an annular coil support or bobbin 64 of molded insulator material. One side wall of coil support 64 is provided with two integral alignment projections or bosses 67. The opposite side wall of bobbin 64 has two similar integral alignment projections 68; however, each of the bosses 68 has a central aperture that extends completely through the boss. An electrical coil 70 is wound upon bobbin 64 in the space between the bobbin walls.

Generator 11 further comprises a pair of annular magnetically permeable stator members 71 and 72, each of the two stator members being of C-shaped cross-sectional configuration. Stator member 71 has two alignment apertures which are fitted onto the bosses 67 on coil support 64. The other stator member 72 has two alignment apertures that are fitted onto the alignment bosses 68 on the bobbin. The outer rim portion of stator member 71 is formed with a multiplicity of elongated pole pieces 73. Similarly, stator member 72 includes a multiplicity of magnetic teeth or pole pieces 74. Pole pieces 73 and 74 are interleaved one-for-one with each other. The total number of pole pieces 73 and 74 should be made as large as possible consistent with the use of practical manufacturing techniques. In generator 11A there are a total of sixty pole pieces. The total number of pole pieces can be varied to some extent, but as large a number as reasonably possible should be used.

Generator 11A, FIG. 4, further comprises an insulator barrier member 81, preferably formed of molded resin material. The insulator barrier member 81 has a cavity 84 into which a cylindrical stator support 82 is press fit. A sleeve bearing 85 is press fit into sleeve 82; sleeve 85 is preferably a self-lubricating bronze bearing. Two electrical terminals 87 are mounted on the insulator barrier member 81 by suitable means such as rivets 88. The electrical leads for coil 70 are brought out through the apertures in coil support bosses 68 and extend through apertures in insulator barrier 81 to be electrically connected to terminals 87.

Generator 11A further comprises a drive shaft 92 formed with a medial shoulder 93. A metal disc or washer 94 is staked or otherwise securely mounted on shaft 92 adjacent shoulder 93. Washer 94 affords a mounting means for mounting one end of a cylindrical permanent magnet 95 to drive shaft 92 for rotation therewith. The preferred material for permanent magnet 95 is nylon filled with barium ferrite, sintered for dimensional and environmental stability. The permanent magnet 95 is magnetized to afford a multiplicity of magnetic poles, corresponding to the total number of pole pieces 73 and 74 on the stator members 71 and 72, facing toward the magnet. Thus, in generator 11A magnet 95 provides a total of 60 magnetic poles.

One end of shaft 92, the left-hand end as seen in FIG. 4, is provided with drive coupling means for connecting generator 11A to an external shaft or other rotating member. The drive connection comprises a drive tang 98 fitted into a socket in the left-hand end of drive shaft 92. However, other convenient connection means may be employed as desired.

Generator 11A also comprises a mounting nut 101 having a threaded opening 102 at one end. The other end of nut 101 is firmly staked or otherwise affixed to a washer-shaped end wall member 103. A cylindrical housing member 106 having two thin end flanges 107 and 108 completes the generator. Flange 107 is crimped around the rim of the end wall member 103. Flange 108 is crimped around the outer rim of insulator barrier member 81.

Signal generator 11A incorporates a construction which effectively and inherently maintains the operating elements of the generator, the rotor and the stator, in accurate concentric alignment. The large number of magnet poles incorporated in the generator aids materially in affording an output signal that has a consistent amplitude relation with respect to speed, and is particularly advantageous for low speed applications. There is no need to utilize extremely precise tolerances in the manufacture of the generator, and manufacturing and assembly are both simple and economical. General operating characteristics for generator 11A, in one embodiment, are shown in FIG. 5, comprising a speed/voltage curve 51 and a load/voltage curve 52, taken at 500 rpm.

I claim:

1. A two-terminal speed switch control actuated in response to changes in the speed of a rotary shaft above and below a threshold speed, comprising:

a multi-pole sub-fractional permanent magnet AC generator, connectable to a rotary shaft, for generating an initial AC signal having an amplitude which varies in accordance with changes in the speed of the shaft;

threshold circuit means, connected to the generator, for developing a DC switch actuation signal whenever the amplitude of the initial AC signal exceeds a given threshold amplitude indicative of a critical shaft speed, the threshold circuit means comprising a full wave rectifier coupled to a first switching amplifier, the output of the first amplifier comprising the DC switch actuation signal;

and a solid-state switching circuit, having two switch terminals connectable in series with an external DC power supply in an operating circuit for a controlled load, for switching the controlled load into and out of its operating circuit in response to the presence or absence of the switch actuation signal, the switching circuit comprising a second switching amplifier having an actuation input connected to the output stage of the first switching amplifier;

the first switching amplifier being maintained non-conductive whenever the output from the rectifier is below a given threshold amplitude and being driven fully conductive whenever the rectifier output exceeds that threshold amplitude;

each switching amplifier having its output stage connected across the switch terminals so that the external power supply affords a power source for both amplifiers without requiring any additional connection terminals.

2. A speed switch control according to claim 1 in which the second switching amplifier is maintained fully conductive, by the external power source, whenever the threshold circuit amplifier is non-conductive, and is biased to cutoff whenever the threshold circuit amplifier is conductive, so that the control operates as a normally-closed switch that opens when the shaft exceeds a given threshold speed.

3. A speed switch control according to claim 1 in which the second switching amplifier is biased to cutoff whenever the threshold circuit amplifier is non-conductive and is maintained fully conductive whenever the threshold circuit amplifier is conductive, so that the control operates as a normally-open switch that closes when the shaft exceeds a given threshold speed.

4. A speed switch control according to claim 1, in which both switching amplifiers are Darlington amplifiers, and further comprising a third Darlington amplifier, complementary to and connected in parallel with the second switching amplifier.

5. A speed switch control according to claim 1, in which the coupling circuit between the rectifier and the threshold circuit amplifier comprises a voltage divider connected across the output terminals of the rectifier, and a threshold-determining zener diode connecting the voltage divider to the input stage of the threshold circuit amplifier.

* * * * *